(12) United States Patent
Maruyama et al.

(10) Patent No.: US 9,685,305 B2
(45) Date of Patent: Jun. 20, 2017

(54) PLASMA PROCESSING APPARATUS AND PLASMA PROCESSING METHOD

(71) Applicant: Tokyo Electron Limited, Tokyo (JP)

(72) Inventors: Koji Maruyama, Miyagi (JP); Masato Horiguchi, Miyagi (JP); Tetsuri Matsuki, Miyagi (JP); Akira Koshiishi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/903,396

(22) PCT Filed: Jul. 3, 2014

(86) PCT No.: PCT/JP2014/067844
§ 371 (c)(1),
(2) Date: Jan. 7, 2016

(87) PCT Pub. No.: WO2015/019765
PCT Pub. Date: Feb. 12, 2015

(65) Prior Publication Data
US 2016/0163515 A1    Jun. 9, 2016

(30) Foreign Application Priority Data
Aug. 9, 2013 (JP) .................... 2013-166908

(51) Int. Cl.
*H01L 21/306* (2006.01)
*H01J 37/32* (2006.01)
(Continued)

(52) U.S. Cl.
CPC .... *H01J 37/32165* (2013.01); *H01J 37/3244* (2013.01); *H01J 37/32091* (2013.01);
(Continued)

(58) Field of Classification Search
CPC .......... H01J 2237/332; H01J 37/32091; H01J 37/32532; H01J 37/32816;
(Continued)

(56) References Cited

U.S. PATENT DOCUMENTS

| 5,609,690 A | 3/1997 | Watanabe | |
|---|---|---|---|
| 2004/0163764 A1* | 8/2004 | Collins | ................. B01D 53/22 156/345.48 |

(Continued)

FOREIGN PATENT DOCUMENTS

| JP | 07-500459 A | 1/1995 |
|---|---|---|
| JP | 11-067737 A | 3/1999 |

(Continued)

OTHER PUBLICATIONS

International Search Report for PCT/JP2014/067844 dated Sep. 16, 2014.

*Primary Examiner* — Lan Vinh
(74) *Attorney, Agent, or Firm* — Pearne & Gordon LLP

(57) ABSTRACT

A plasma processing apparatus includes a dielectric member having communication holes through which an internal space communicates with a processing space; a first electrode and a second electrode; a first gas supply device which supplies a first processing gas; a first high frequency power supply which supplies a first high frequency power to at least one of the electrodes to generate a first plasma of the first processing gas; a depressurizing device which introduces the first processing gas and radicals in the first plasma; a second high frequency power supply which supplies a second high frequency power to generate a second plasma of the first processing gas and to attract ions; and a control unit which adjusts, by controlling a total amount of the first high (Continued)

frequency powers, the radical amount in the second plasma and adjusts, by controlling a ratio therebetween, the ion amount therein.

6 Claims, 6 Drawing Sheets

(51) Int. Cl.
  *H01L 21/02* (2006.01)
  *H01L 21/3065* (2006.01)
  *H01L 21/67* (2006.01)

(52) U.S. Cl.
  CPC .. *H01J 37/32357* (2013.01); *H01J 37/32422* (2013.01); *H01J 37/32532* (2013.01); *H01J 37/32568* (2013.01); *H01J 37/32816* (2013.01); *H01L 21/02104* (2013.01); *H01L 21/3065* (2013.01); *H01L 21/67069* (2013.01); *H01J 2237/332* (2013.01); *H01J 2237/334* (2013.01)

(58) Field of Classification Search
  CPC .......... H01J 37/32422; H01J 37/32568; H01J 21/3065; H01J 21/02104
  USPC .............. 156/345.3, 345.19, 345.47, 345.48; 438/706, 710, 712, 714, 717
  See application file for complete search history.

(56) References Cited

U.S. PATENT DOCUMENTS

| | | | |
|---|---|---|---|
| 2006/0113037 A1* | 6/2006 | Nishio | C23F 4/00 156/345.24 |
| 2008/0178805 A1 | 7/2008 | Paterson | |
| 2009/0165955 A1 | 7/2009 | Sumiya | |
| 2009/0255800 A1* | 10/2009 | Koshimizu | H01J 37/32165 204/164 |
| 2010/0006226 A1 | 1/2010 | Cho | |
| 2010/0190350 A1* | 7/2010 | Yatsuda | H01J 37/32091 438/710 |
| 2011/0214815 A1* | 9/2011 | Koshiishi | H01J 37/32082 156/345.38 |
| 2012/0180954 A1 | 7/2012 | Yang | |
| 2012/0214313 A1* | 8/2012 | Ooya | H01J 37/32091 438/712 |

FOREIGN PATENT DOCUMENTS

| | | |
|---|---|---|
| JP | 2001-230208 A | 8/2001 |
| JP | 2001-271168 A | 10/2001 |
| JP | 2010-74065 A | 4/2010 |
| WO | 94/05035 A1 | 3/1994 |
| WO | 2012/099681 A2 | 7/2012 |

\* cited by examiner

PLASMA PROCESSING APPARATUS AND PLASMA PROCESSING METHOD

CROSS-REFERENCE TO RELATED APPLICATION

This Application is a U.S. national phase application under 35 U.S.C. §371 of PCT Application No. PCT/JP2014/067844 filed on Jul. 3, 2014, which claims the benefit of Japanese Patent Application No. 2013-166908 filed on Aug. 9, 2013, the entire disclosures of which are incorporated herein by reference.

TECHNICAL FIELD

The various embodiments described herein pertain generally to a plasma processing apparatus and a plasma processing method.

BACKGROUND ART

In a semiconductor manufacturing process, a plasma process is widely performed to form or etch a thin film, or the like. To obtain a highly functional high-performance semiconductor, it is desirable to perform a uniform plasma process on a processing target surface of a processing target object.

In a plasma process, plasma of a processing gas is generated. The plasma contains active species such as ions and radicals. The plasma process is performed by reacting the processing target surface of the processing target object with the plasma containing the ions and the radicals.

Recently, for the semiconductor manufacturing process, there has been proposed a plasma processing apparatus in which a grid electrode provided with a multiple number of through holes are disposed within a processing vessel for performing therein the plasma process on the processing target object, and the inside of the processing vessel is divided into two spaces by the grid electrode.

In this plasma processing apparatus, the processing target object is placed on a mounting table which is provided within a processing space under the grid electrode, and a processing gas for use in the plasma process is supplied into a plasma generation space above the grid electrode. Further, in this plasma processing apparatus, a plasma of the processing gas supplied into the plasma generation space is generated by supplying a high frequency power to the plasma generation space. Furthermore, in this plasma processing apparatus, the processing gas and the radicals in the plasma generated in the plasma generation space are attracted into the processing space from the plasma generation space via the grid electrode by depressurizing the processing space. Further, in this plasma processing apparatus, a plasma of the processing gas introduced into the processing space is generated by supplying a high frequency bias power to the mounting table, and the ions in the generated plasma are attracted into the processing target object placed on the mounting table. Through these operations, a uniform plasma process can be performed on the processing target object while controlling the density of the radicals in the plasma.

Patent Document 1: Japanese Patent Laid-open Publication No. H11-067737
Patent Document 2: Japanese Patent Laid-open Publication (Translation of PCT Application) No. H07-500459

DISCLOSURE OF THE INVENTION

Problems to be Solved by the Invention

However, in the above-described prior art, it has been difficult to control the densities of the ions and the radicals in the plasma independently to obtain a required processing characteristic of the processing target object.

That is, in the above-described prior art, since a sheath is not formed between the plasma generated in the plasma generation space and the plasma generated in the processing space, the plasmas have the same potential. For this reason, in the above-described prior art, it is difficult to control the density of the ions and the density of the radials independently to obtain a required processing characteristic such as a CD (Critical Dimension) or a mask selectivity in the processing target surface of the processing target object.

Means for Solving the Problems

In an exemplary embodiment, a plasma processing apparatus includes a processing vessel having a processing space formed therein; a mounting table provided within the processing space, and configured to mount a processing target object thereon; a dielectric member, disposed at the processing vessel to close the processing space, having an internal space and communication holes through which the internal space is allowed to communicate with the processing space; a first electrode and a second electrode provided within the dielectric member and arranged to face each other with the internal space therebetween; a first gas supply device configured to supply a first processing gas for a plasma process into the internal space; a first high frequency power supply configured to supply a first high frequency power to at least one of the first electrode and the second electrode to generate a first plasma of the first processing gas supplied into the internal space; a depressurizing device configured to depressurize the processing space to introduce the first processing gas and radicals in the first plasma into the processing space from the internal space through the communication holes; a second high frequency power supply configured to supply a second high frequency power to the mounting table to generate a second plasma of the first processing gas introduced into the processing space and to attract ions in the second plasma into the processing target object; and a control unit configured to adjust, by controlling a total amount of the first high frequency power supplied to the first electrode and the first high frequency power supplied to the second electrode, an amount of the radicals in the first plasma introduced into the processing space from the internal space through the communication holes and adjust, by the radicals, an amount of radicals in the second plasma, and configured to adjust, by controlling a ratio between the first high frequency power supplied to the first electrode and the first high frequency power supplied to the second electrode, an amount of electrons in the first plasma introduced into the processing space from the internal space through the communication holes and adjust, by the electrons, an amount of the ions in the second plasma.

Effect of the Invention

According to the plasma processing apparatus of the exemplary embodiment, it is possible to control the density of the ions and the density of the radicals in the plasma within the processing space independently to obtain a required processing characteristic of the processing target object.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
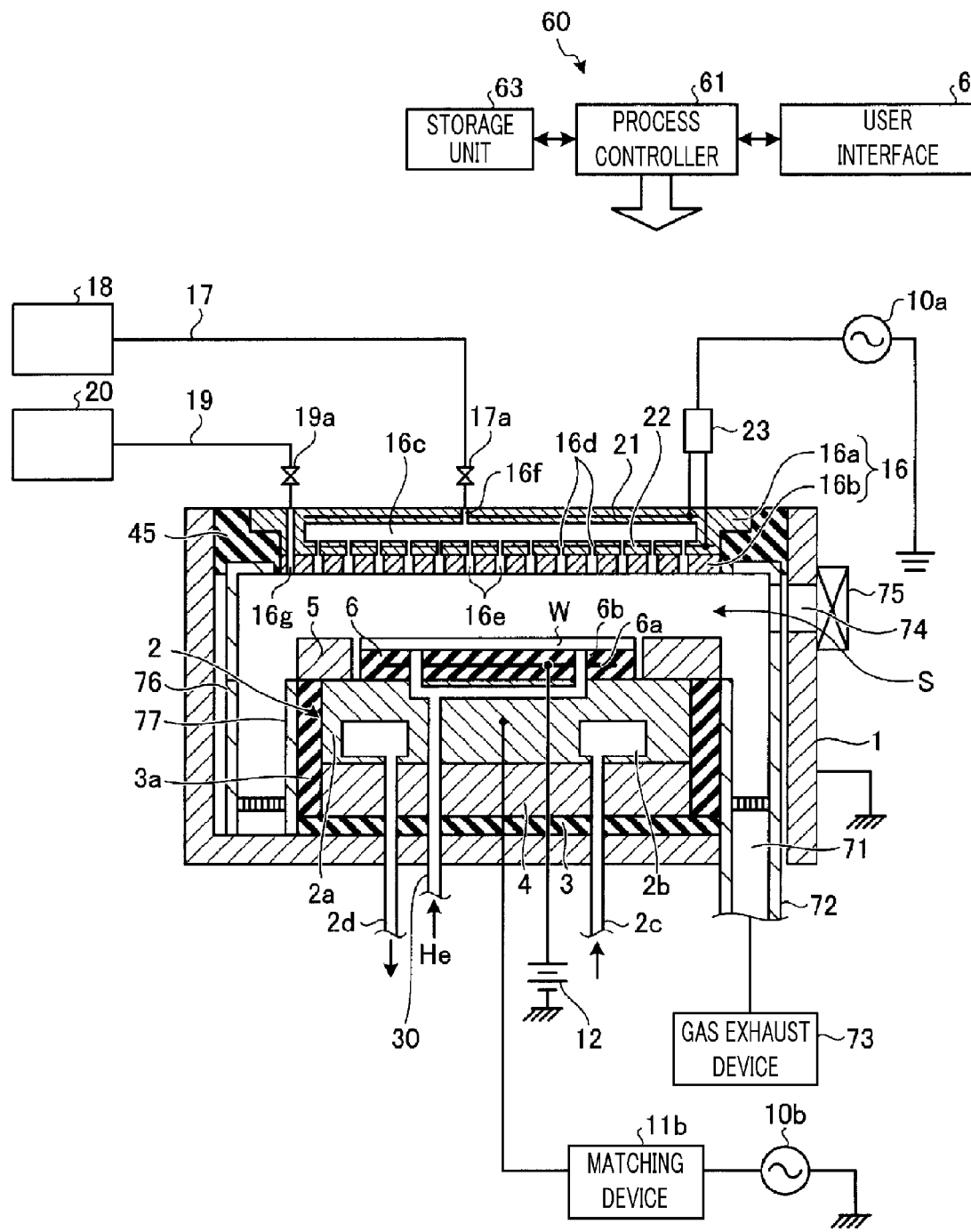
FIG. 1 is a schematic cross sectional view illustrating a plasma processing apparatus according to a first exemplary embodiment.

In the following, a plasma processing apparatus and a plasma processing method according to exemplary embodiments will be described in detail, and reference is made to the accompanying drawings, which form a part of the description. Here, however, it should be noted that the exemplary embodiments are not intended to be limiting. The various exemplary embodiments can be appropriately combined as long as the contents of processes are not contradictory.

In an exemplary embodiment, a plasma processing apparatus includes a processing vessel having a processing space formed therein; a mounting table provided within the processing space, and configured to mount a processing target object thereon; a dielectric member, disposed at the processing vessel to close the processing space, having an internal space and communication holes through which the internal space is allowed to communicate with the processing space; a first electrode and a second electrode provided within the dielectric member and arranged to face each other with the internal space therebetween; a first gas supply device configured to supply a first processing gas for a plasma process into the internal space; a first high frequency power supply configured to supply a first high frequency power to at least one of the first electrode and the second electrode to generate a first plasma of the first processing gas supplied into the internal space; a depressurizing device configured to depressurize the processing space to introduce the first processing gas and radicals in the first plasma into the processing space from the internal space through the communication holes; a second high frequency power supply configured to supply a second high frequency power to the mounting table to generate a second plasma of the first processing gas introduced into the processing space and to attract ions in the second plasma into the processing target object; and a control unit configured to adjust, by controlling a total amount of the first high frequency power supplied to the first electrode and the first high frequency power supplied to the second electrode, an amount of the radicals in the first plasma introduced into the processing space from the internal space through the communication holes and adjust, by the radicals, an amount of radicals in the second plasma, and configured to adjust, by controlling a ratio between the first high frequency power supplied to the first electrode and the first high frequency power supplied to the second electrode, an amount of electrons in the first plasma introduced into the processing space from the internal space through the communication holes and adjust, by the electrons, an amount of the ions in the second plasma.

Further, in the exemplary embodiment, the internal space of the dielectric member may be divided into a plurality of concentric sub-spaces along a radial direction of the processing target object, each of the sub-spaces may communicate with the processing space through the communication holes, and the first electrode and the second electrode may be provided at each of the sub-spaces, and arranged to face each other with a corresponding one of the sub-spaces therebetween. By controlling the total amount of the first high frequency power supplied to the first electrode and the first high frequency power supplied to the second electrode, the control unit may adjust the amount of the radicals in the first plasma introduced into the processing space from each of the sub-spaces through the communication holes and may adjust a distribution of the amount of the radicals in the second plasma along the radial direction of the processing target object by the radicals. Further, by controlling the ratio between the first high frequency power supplied to the first electrode and the first high frequency power supplied to the second electrode, the control unit may adjust the amount of the electrons in the first plasma introduced into the processing space from each of the sub-spaces through the communication holes and may adjust a distribution of the amount of the ions in the second plasma along the radial direction of the processing target object by the electrons.

Moreover, in the exemplary embodiment, the control unit may adjust a phase difference between the first high frequency power supplied to the first electrode and the first high frequency power supplied to the second electrode.

Further, in the exemplary embodiment, the control unit may adjust the phase difference between the first high frequency power supplied to the first electrode and the first high frequency power supplied to the second electrode to be 180°.

In the exemplary embodiment, the plasma processing apparatus may further include a second gas supply device configured to supply a second processing gas into the processing space. The second high frequency power supply may supply the second high frequency power to the mounting table to generate a third plasma of the first processing gas and the second processing gas supplied into the processing space and to attract ions in the third plasma into the processing target object. The control unit may control ON/OFF of the second high frequency power supply intermittently. During a period while the second high frequency power supply is controlled to be turned OFF, by controlling the total amount of the first high frequency power supplied to the first electrode and the first high frequency power supplied to the second electrode, the control unit adjusts the amount of the radicals in the first plasma introduced into the processing space from the internal space through the communication holes, and also, by controlling the ratio between the first high frequency power supplied to the first electrode and the first high frequency power supplied to the second electrode, the control unit adjusts the amount of the electrons in the first plasma introduced into the processing space from the internal space through the communication holes; activates a surface of the processing target object by the electrons; and generates a reaction product by reacting the activated surface of the processing target object with the radicals in the first plasma introduced into the processing space. Further, during a period while the second high frequency power supply is controlled to be turned ON, by controlling the total amount of the first high frequency power supplied to the first electrode and the first high frequency power supplied to the second electrode, the control unit adjusts the amount of the radicals in the first plasma introduced into the processing space from the internal space through the communication holes and adjusts, by the radicals, the amount of the radicals in the third plasma, and also, by controlling the ratio between the first high frequency power supplied to the first electrode and the first high frequency power supplied to the second electrode, the control unit adjusts the amount of the electrons in the first plasma introduced into the processing space from the internal space through the communication holes; adjusts an amount of the ions in the third plasma by the electrons; and etches the reaction product with the third plasma in which the amounts of the ions and radicals are controlled.

In another exemplary embodiment, a plasma processing method is performed in a plasma processing apparatus including a processing vessel having a processing space formed therein; a mounting table provided within the processing space, and configured to mount a processing target object thereon; a dielectric member, disposed at the processing vessel to close the processing space, having an internal space and communication holes through which the internal space is allowed to communicate with the processing space; a first electrode and a second electrode provided within the dielectric member and arranged to face each other with the internal space therebetween; a first gas supply device configured to supply a first processing gas for a plasma process into the internal space; a first high frequency power supply configured to supply a first high frequency power to at least one of the first electrode and the second electrode to generate a first plasma of the first processing gas supplied into the internal space; a depressurizing device configured to depressurize the processing space and, thus, introduce the first processing gas and radicals in the first plasma into the processing space from the internal space through the communication holes; a second high frequency power supply configured to supply a second high frequency power to the mounting table to generate a second plasma of the first processing gas introduced into the processing space and to attract ions in the second plasma into the processing target object. The plasma processing method includes adjusting an amount of the radicals in the first plasma introduced into the processing space from the internal space through the communication holes and adjusting, by these radicals, an amount of radicals in the second plasma by controlling a total amount of the first high frequency power supplied to the first electrode and the first high frequency power supplied to the second electrode; and adjusting an amount of electrons in the first plasma introduced into the processing space from the internal space through the communication holes and adjusting, by these electrons, an amount of ions in the second plasma by controlling a ratio between the first high frequency power supplied to the first electrode and the first high frequency power supplied to the second electrode.

First Exemplary Embodiment

FIG. 1 is a schematic cross sectional view illustrating a plasma processing apparatus according to a first exemplary embodiment. As shown in FIG. 1, the plasma processing apparatus according to the first exemplary embodiment includes a hermetically sealed processing vessel 1 which is electrically grounded. The processing vessel 1 has therein a processing space S in which a plasma process is performed. The processing vessel 1 has a cylindrical shape and is made of, by way of non-limiting example, aluminum having thereon an anodically oxidized film. Provided within the processing space S of the processing vessel 1 is a mounting table 2 which is configured to mount a semiconductor wafer W as a processing target object thereon in a horizontal posture.

A base member 2a of the mounting table 2 is made of a conductive metal such as, but not limited to, aluminum, and serves as a lower electrode. The mounting table 2 is supported on a conductive supporting table 4 with an insulating plate 3 therebetween. Further, a focus ring 5 made of, for example, single crystalline silicon, SiC or quartz is provided on a peripheral portion of a top surface of the mounting table 2. Further, a cylindrical inner wall member 3a made of, by way of non-limiting example, quartz or alumina is provided to surround the mounting table 2 and the supporting table 4.

An electrostatic chuck 6 configured to attract and hold the semiconductor wafer W electrostatically is provided on the top surface of the mounting table 2. The electrostatic chuck 6 includes an electrode 6a embedded in an insulator 6b, and the electrode 6a is connected with a DC power supply 12. By applying a DC voltage from the DC power supply 12 to the electrode 6a, the semiconductor wafer W is attracted to and held by a Coulomb force or the like.

A coolant path 2b is formed within the mounting table 2, and a coolant inlet line 2c and a coolant outlet line 2d are connected to the coolant path 2b. By circulating a coolant such as galden within the coolant path 2b, the supporting table 4 and the mounting table 2 can be controlled to have a preset temperature. Further, a backside gas supply line 30 through which a cold heat transfer gas (backside gas) such as a helium gas is supplied to a rear surface side of the semiconductor wafer W is provided to penetrate the mounting table 2 and so forth. The backside gas supply line 30 is connected to a non-illustrated backside gas supply source. With this configuration, it is possible to control the semiconductor wafer W attracted to and held on the top surface of the mounting table 2 by the electrostatic chuck 6 to have a preset temperature.

A dielectric member 16 is provided above the mounting table 2 to face the mounting table 2 in parallel, that is, to face the semiconductor wafer W held on the mounting table 2. The dielectric member 16 is mounted to the processing vessel 1 with an insulating member 45 therebetween to close the processing space S. The dielectric member 16 includes a disk-shaped internal space and communication holes through which the internal space communicates the processing space S. Specifically, the dielectric member 16 is made of such a material as, but not limited to, alumina, ceramic, quartz or silicon. Further, the dielectric member 16 includes an upper dielectric member 16a and a circular plate-shaped lower electric member 16b detachably attached to the upper dielectric member 16a.

The upper dielectric member 16a is formed in a disk shape having the same diameter as that of the lower dielectric member 16b. A gas diffusion space 16c, which is the internal space, is formed within the upper dielectric member 16a. A multiple number of gas through holes 16d are formed at a bottom portion of the gas diffusion space 16c.

Further, the lower dielectric member 16b is provided with a multiple number of gas inlet holes 16e formed through the lower dielectric member 16b in a thickness direction thereof such that the gas inlet holes 16e of the lower dielectric member 16b communicate with the gas through holes 16d of the upper dielectric member 16a, respectively. The gas inlet holes 16e of the lower dielectric member 16b and the gas through holes 16d of the upper dielectric member 16a form communication holes through which the gas diffusion space 16c communicates with the processing space S. With this configuration, the processing gas introduced into the gas diffusion space 16c is supplied into the processing space S within the processing vessel 1 via the gas through holes 16d and the gas inlet holes 16e in a distributed manner as in a shower device. In the following description, the gas through holes 16d and the gas inlet holes 16e may sometimes be appropriately referred to "communication holes."

The dielectric member 16 (the upper dielectric member 16a) is provided with a gas inlet opening 16f through which the processing gas is introduced into the gas diffusion space 16c. A gas supply line 17 is connected to the gas inlet opening 16f, and a base end portion of the gas supply line 17 is connected to a first gas supply source 18. Furthermore, the gas supply line 17 is equipped with a valve 17a configured to open or close the gas supply line 17, a non-illustrated flow rate controller (MFC: Mass Flow Controller), and so forth.

The first gas supply source 18 is configured to supply a first processing gas into the gas diffusion space 16c via the gas supply line 17 and the gas inlet opening 16f. When a plasma etching process is performed on, for example, a resist film, an antireflection film, an organic film, an oxide film, a nitride film, a low dielectric film, titanium nitride, silicon, or the like, the first gas supply source 18 supplies a CF-based gas, a CHF-based gas, $O_2$, $Cl_2$, HBr, Ar, $H_2$, He, or the like into the gas diffusion space 16c as the first processing gas. Further, when an ALE (Atomic Layer Etching) process in which a processing target film is etched on an atomic layer basis is performed, the first gas supply source 18 supplies $Cl_2$ or the like into the gas diffusion space 16c as the first processing gas. The first processing gas supplied into the gas diffusion space 16c from the first gas supply source 18 is introduced into the processing space S within the processing vessel 1 through the communication holes. The first gas supply source 18 is an example of a first gas supply device.

The dielectric member 16 has a through hole 16g, which is formed through the upper dielectric member 16a and the lower dielectric member 16b in a thickness direction thereof to reach the processing space S within the processing vessel 1. The through hole 16g is connected to a gas supply line 19, and a base end portion of the gas supply line 19 is connected to a second gas supply source 20. Further, the gas supply line 19 is equipped with a valve 19a configured to open or close the gas supply line 19, a non-illustrated flow rate controller (MFC), and so forth.

The second gas supply source 20 is configured to supply a second processing gas into the processing space S via the gas supply line 19 and the through hole 16g. For example, when the ALE process is performed, the second gas supply source 20 supplies Ar or the like into the processing space S as the second processing gas. The second gas supply source 20 is an example of a second gas supply device. Further, the second processing gas may be the same as or different from the first processing gas.

An upper electrode 21 and a lower electrode 22 are provided within the dielectric member 16 (upper dielectric member 16a). The upper electrode 21 and the lower electrode 22 are arranged to face each other with the gas diffusion space 16c therebetween. The upper electrode 21 and the lower electrode 22 are embedded in the dielectric member 16 by thermally spraying a conductive material such as, but not limited to, molybdenum and, also, thermally spraying a dielectric material thereon.

The upper electrode 21 and the lower electrode 22 are connected to a first high frequency power supply 10a via a power splitter 23. The first high frequency power supply 10a is configured to supply a high frequency power having a frequency equal to or less than, e.g., 1 MHz, desirably, 400 kHz, to at least one of the upper electrode 21 and the lower electrode 22 via the power splitter 23. To elaborate, a plasma of the first processing gas, which is supplied from the first gas supply source 18 into the gas diffusion space 16c, is generated by supplying the high frequency power to at least one of the upper electrode 21 and the lower electrode 22 via the power splitter 23 from the first high frequency power supply 10a. In the following description, the high frequency power supplied to at least one of the upper electrode 21 and the lower electrode 22 from the first high frequency power supply 10a via the power splitter 23 will be appropriately referred to as "plasma generation power." Further, in the following description, the plasma of the first processing gas generated within the gas diffusion space 16c by supplying the plasma generation power will be appropriately referred to as "first plasma."

The power splitter 23 is configured to split the plasma generation power inputted from the first high frequency power supply 10a and distribute the split powers to the upper electrode 21 and the lower electrode 22, respectively. A split ratio by which the power splitter 23 splits the plasma generation power, that is, a ratio between plasma generation powers respectively supplied to the upper electrode 21 and the lower electrode 22 from the first high frequency power supply 10a is variable. A control value for the split ratio of the power splitter 23 is inputted by a control unit 60 to be described later. That is, the power splitter 23 splits the plasma generation power inputted from the first high frequency power supply 10a with the control value for the split ratio inputted by the control unit 60 and sends the split powers to the upper electrode 21 and the lower electrode 22, respectively.

Further, the power splitter 23 also has a function of adjusting a phase difference between the plasma generation powers respectively supplied to the upper electrode 21 and the lower electrode 22 from the first high frequency power supply 10a. A control value for the phase difference between the plasma generation powers, which is adjusted by the power splitter 23, is inputted by, for example, the control unit 60. That is, the power splitter 23 adjusts the phase difference between the plasma generation powers, which are respectively supplied to the upper electrode 21 and the lower electrode 22 from the first high frequency power supply 10a, with the control value for the phase difference between the plasma generation powers, which is inputted by the control unit 60.

The base member 2a of the mounting table 2 is connected to a second high frequency power supply 10b via a matching device 11b. The second high frequency power supply 10b is configured to supply a high frequency power having a frequency in the range from, e.g., 400 kHz to 27 MHz, desirably, 13 MHz, to the mounting table 2 via the matching device 11b. To be more specific, by supplying the high frequency power to the mounting table 2 from the second high frequency power supply 10b, a plasma of the first processing gas introduced into the processing space S is generated, and ions in the generated second plasma are attracted into the semiconductor wafer W. Hereinafter, the high frequency power supplied from the second high frequency power supply 10b to the mounting table 2 will be appropriately referred to as "bias power." Further, in the following description, the plasma of the first processing gas generated within the processing space S by supplying the bias power will be appropriately referred to as "second plasma."

When the ALE process is performed, the second high frequency power supply 10b is operated as follows. That is, in addition to the first processing gas, the second processing gas such as Ar is supplied into the processing space S from the second gas supply source 20. A plasma is generated by supplying the bias power to the mounting table 2 from the second high frequency power supply 10b, and ions in the generated plasma are attracted into the semiconductor wafer W. In the following description, the plasma of the first processing gas and the second processing gas generated within the processing space S by supplying the bias power will be appropriately referred to as "third plasma."

A gas exhaust opening 71 is formed at a bottom portion of the processing vessel 1, and a gas exhaust device 73 is connected to the gas exhaust opening 71 via a gas exhaust line 72. The gas exhaust device 73 has a vacuum pump and is configured to depressurize the processing space S within the processing vessel 1 to a preset pressure by operating the vacuum pump. To elaborate, the gas exhaust device 73 depressurizes the processing space S, so that the processing gas and radicals in the first plasma generated within the gas diffusion space 16c are introduced into the processing space S from the gas diffusion space 16c through the communication holes (the gas through holes 16d and the gas inlet holes 16e). The gas exhaust device 73 is an example of a depressurizing device.

A carry-in/out opening 74 for the semiconductor wafer W is formed at the sidewall of the processing vessel 1, and a gate valve 75 configured to open or close the carry-in/out opening 74 is provided at the carry-in/out opening 74.

In the drawing, reference numerals 76 and 77 denote deposition shields detachably provided. The deposition shields 76 and 77 are provided along an inner wall surface of the processing vessel 1, and serve to suppress an etching byproduct (deposit) from adhering to the processing vessel 1.

An overall operation of the plasma etching apparatus having the above-described configuration is controlled by the control unit 60. The control unit 60 includes a process controller 61 having a CPU and configured to control individual components of the plasma etching apparatus; a user interface 62; and a storage unit 63.

The user interface 62 includes a keyboard through which a process manager inputs commands to manage the plasma etching apparatus; a display that visually displays an operational status of the plasma etching apparatus; and so forth.

The storage unit 63 stores therein control programs (software) for implementing various processes performed in the plasma etching apparatus under the control of the process controller 61, and recipes including processing condition data or the like. In response to an instruction from the user interface 62, a necessary recipe is retrieved from the storage unit 63 and executed by the process controller 61, so that a required process is performed in the plasma etching apparatus under the control of the process controller 61. Further, the control programs or the recipes including the processing condition data may be used while being stored in a computer-readable storage medium (e.g., a hard disk, a CD, a flexible disk, a semiconductor memory, etc.), or may be used on-line by being received from another apparatus through, for example, a dedicated line, whenever necessary.

By way of example, the control unit 60 controls the individual components of the plasma etching apparatus to perform a plasma process to be described later. As a specific example, when a plasma etching process is performed on an organic film, the control unit 60 performs the following operations. That is, a total amount of the plasma generation powers respectively supplied to the upper electrode 21 and the lower electrode 22 from the first high frequency power supply 10a is controlled by the control unit 60. As a result, the amount of the radicals in the first plasma supplied into the processing space S from the gas diffusion space 16c through the communication holes is adjusted and the amount of radicals in the second plasma is also adjusted by the radicals in the first plasma. Furthermore, a ratio between the plasma generation powers respectively supplied to the upper electrode 21 and the lower electrode 22 from the first high frequency power supply 10a is controlled by the control unit 60. As a result, electrons in the first plasma are allowed to be moved into the processing space S from the gas diffusion space 16c through the communication holes and the amount of ions in the second plasma are adjusted by these electrons. The first plasma and the second plasma have different potentials. An anode sheath is formed above the first plasma, and a cathode sheath is formed under the first plasma. Likewise, an anode sheath is formed above the second plasma, and a cathode sheath is formed under the second plasma. That is, the cathode sheath of the first plasma and the anode sheath of the second plasma are adjacent to each other. Therefore, the electrons in the first plasma are accelerated by a potential difference between the cathode sheath of the first plasma and the anode sheath of the second plasma, and introduced into the second plasma as an electron beam. The magnitude of the cathode sheath of the first plasma can be easily adjusted by controlling the ratio between the plasma generation powers respectively supplied to the upper electrode 21 and the lower electrode 22 from the above-described first high frequency power supply 10a. As a result, incident energy of the electron beam and the amount of the ions in the second plasma can be easily adjusted. Moreover, by controlling the total amount of the plasma generation powers respectively supplied to the upper electrode 21 and the lower electrode 22 from the first high frequency power supply 10a, the amount of the radicals in the first plasma can be easily adjusted. That is, as stated above, the amount of the radicals and the amount of the ions can be independently controlled by regulating the total amount and the ratio between the powers supplied from the first high frequency power supply 10a, respectively, so that a desired processing characteristic can be achieved. Here, the processing characteristic includes a plasma processing rate (an etching rate, a deposition rate, etc.), a processing uniformity over an entire surface of the wafer W, a device shape, or the like.

Further, as another example, when the ALE process is performed, the control unit 60 performs the following operations. That is, the control unit 60 controls ON/OFF of the second high frequency power supply 10b intermittently. During a period while the second high frequency power supply 10b is controlled to be turned OFF, the total amount of the plasma generation powers respectively supplied to the upper electrode 21 and the lower electrode 22 is controlled by the control unit 60. As a result, the amount of the radicals in the first plasma supplied into the processing space S from the gas diffusion space 16c through the communication holes is adjusted. Furthermore, the ratio between the plasma generation powers respectively supplied to the upper electrode 21 and the lower electrode 22 is controlled by the controls unit 60. As a result, the electrons in the first plasma are allowed to be accelerated and introduced as an electron beam into the processing space S from the gas diffusion space 16c through the communication holes. A surface of the processing target object is activated by the electrons, and a reaction product is generated by a reaction between the activated surface of the processing target object and the radicals in the first plasma introduced into the processing space S. Further, during a period while the second high frequency power supply 10b is controlled to be turned ON, the total amount of the plasma generation powers respectively supplied to the upper electrode 21 and the lower electrode 22 is controlled by the control unit 60. As a result, the amount of the radicals in the first plasma supplied into the processing space form the internal space through the communication holes is adjusted, and the amount of radicals in the third plasma is adjusted by the radicals in the first plasma. Moreover, the ratio between the first high frequency powers respectively supplied to the upper electrode 21 and the lower electrode 22 is controlled by the control unit 60. As a result, the electrons in the first plasma are supplied into the processing space S from the gas diffusion space 16c through the communication holes, and the amount of ions in the third plasma of the first processing gas and the second processing gas is adjusted by these electrons. Furthermore, the reaction product is etched by the third plasma in which the amount of the ions is controlled. Here, controlling the ON/OFF of the second high frequency power supply 10b intermittently corresponds to, for example, repeatedly performing a supply of the bias power from the second high frequency power supply 10b and a stop of the supply of the bias power alternately.

Figure 2:
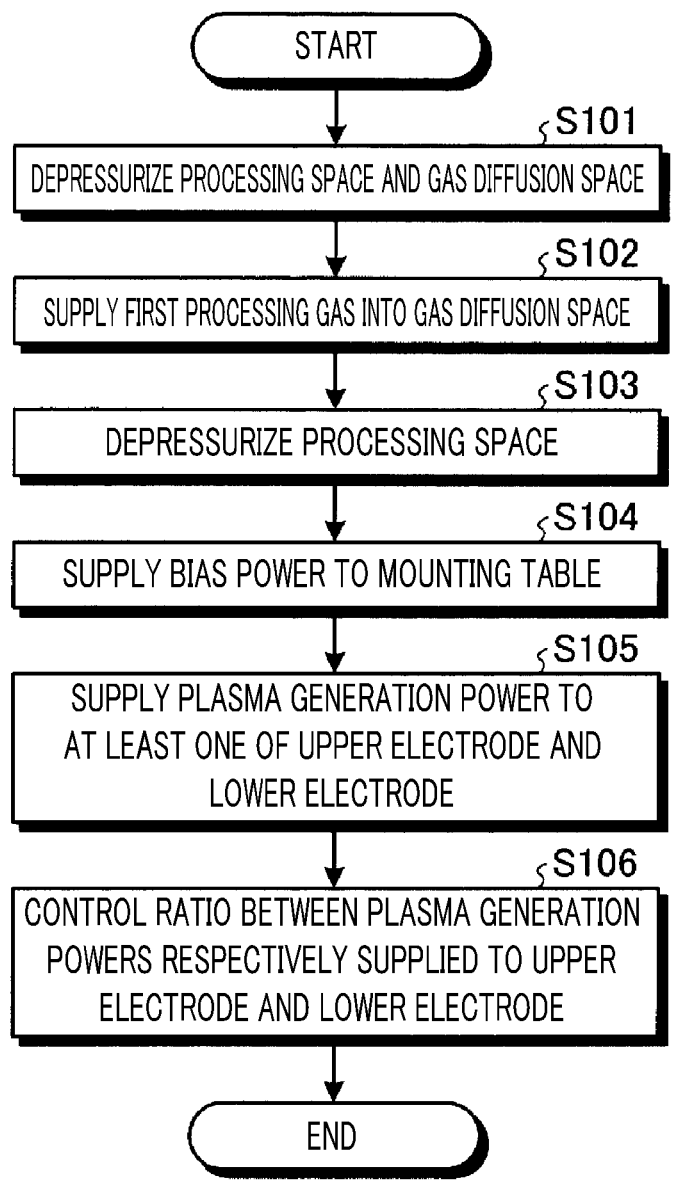
FIG. 2 is a flowchart for describing an example of a processing sequence of a plasma process performed in the plasma processing apparatus according to the first exemplary embodiment.

Now, an example of a processing sequence of a plasma process performed in the plasma processing apparatus according to the first exemplary embodiment will be explained. FIG. 2 is a flowchart illustrating an example of the processing sequence of the plasma process performed in the plasma processing apparatus according to the first exemplary embodiment. In the example shown in FIG. 2, a processing sequence of a plasma etching process performed on an organic film will be illustrated.

As depicted in FIG. 2, the plasma processing apparatus depressurizes the processing space S and the gas diffusion space 16c within the processing vessel 1 (process S101). Then, the plasma processing apparatus supplies the first processing gas into the gas diffusion space 16c of the dielectric member 16 (process S102). For example, the plasma processing apparatus supplies a CF-based gas and/or a CHF-based gas into the gas diffusion space 16c of the dielectric member 16 as the processing gas.

A more specific example will be elaborated. The control unit 60 of the plasma processing apparatus supplies the first processing gas into the gas diffusion space 16c of the dielectric member 16 from the first gas supply source 18.

Thereafter, the plasma processing apparatus depressurizes the processing space S until a pressure difference between the processing space S and the gas diffusion space 16c is stabilized (process S103). For example, the plasma processing apparatus depressurizes the processing space S within the processing vessel 1 until the pressure of the processing space S within the processing vessel 1 becomes equal to or less than $1/10$ (desirably, $1/100$) of the pressure of the gas diffusion space 16c of the dielectric member 16.

A more specific example will be elaborated. The control unit 60 of the plasma processing apparatus depressurizes the processing space S within the processing vessel 1 by operating the gas exhaust device 73. At this time, diameters of the communication holes between the processing space S and the gas diffusion space 16c are adjusted in advance, and the processing space S is depressurized such that a stable pressure difference between the processing space S and the gas diffusion space 16c is obtained. By the depressurization of the processing space S, the first processing gas and the radicals in the first plasma generated in the gas diffusion space 16c are introduced into the processing space S from the gas diffusion space 16c through the communication holes.

Subsequently, the plasma processing apparatus supplies the bias power to the mounting table 2 (process S104). By way of example, the plasma processing apparatus supplies the high frequency power of 13 MHz to the mounting table 2 as the bias power.

A more specific example will be elaborated. By supplying the bias power to the mounting table 2 from the second high frequency power supply 10b, the control unit 60 of the plasma processing apparatus generates the second plasma of the first processing gas introduced into the processing space S and allows the ions in the generated second plasma to be attracted into the semiconductor wafer W.

Thereafter, the plasma processing apparatus supplies the plasma generation power to at least one of the upper electrode 21 and the lower electrode 22 (process S105). For example, the plasma processing apparatus supplies the high frequency power of 400 kHz to at least one of the upper electrode 21 and the lower electrode 22 as the plasma generation power.

A more specific example will be elaborated. By supplying the plasma generation power to at least one of the upper electrode 21 and the lower electrode 22 from the first high frequency power supply 10a via the power splitter 23, the control unit 60 of the plasma processing apparatus generates the first plasma of the first processing gas supplied into the gas diffusion space 16c.

A more specific example will be elaborated. By controlling the total amount of plasma generation powers respectively supplied to the upper electrode 21 and the lower electrode 22, the control unit 60 of the plasma processing apparatus adjusts the amount of radicals in the first plasma supplied into the processing space S from the gas diffusion space 16c through the communication holes and, by these radicals, also adjusts the amount of radicals in the second plasma. Accordingly, the density of the radicals in the second plasma is controlled by the total amount of the plasma generation powers respectively supplied to the upper electrode 21 and the lower electrode 22.

Subsequently, the plasma processing apparatus controls the ratio between the plasma generation powers respectively supplied to the upper electrode 21 and the lower electrode 22 (process S106). For example, the plasma processing apparatus controls the ratio between the plasma generation powers respectively supplied to the upper electrode 21 and the lower electrode 22 by the power splitter 23 configured to split the plasma generation power and distribute the split powers to the upper electrode 21 and the lower electrode 22, respectively.

A more specific example will be elaborated. By controlling the ratio between the plasma generation powers respectively supplied to the upper electrode 21 and the lower electrode 22, the control unit 60 of the plasma processing apparatus adjusts the amount of electrons in the first plasma supplied into the processing space S from the gas diffusion space 16c through the communication holes, and, by these electrons, also adjusts the amount of ions in the second plasma. The first plasma and the second plasma have different potentials. The electrons are accelerated by the sheath of the first plasma and the sheath of the second plasma, and introduced into the second plasma as the electron beam. At this time, the control unit 60 outputs, to the power splitter 23, a value of P1:P2=(plasma generation power supplied to the upper electrode 21):(plasma generation power supplied to the lower electrode 22) as a control value for the split ratio of the power splitter 23. By way of example, for the split ratio of the power splitter 23, the control unit 60 outputs a control value in which the P2 is larger than the P1. As the P2 is increased with respect to the P1, the number of electrons in the first plasma moved into the processing space S from the gas diffusion space 16c through the communication holes is increased. As a result, the number of electrons that collide with gas atoms in the processing gas within the processing space S is increased as well, so that the amount of the ions in the second plasma generated in the processing space S is also increased. As another example, for the split ratio of the power splitter 23, the control unit 60 outputs a control value in which the P2 is smaller than the P1. As the P2 is decreased with respect to P1, the number of electrons in the first plasma moved into the processing space S from the gas diffusion space 16c through the communication holes is decreased. As a result, the number of electrons which are collided with the gas atoms in the processing gas within the processing space S is also decreased, so that the amount of the ions in the second plasma generated in the processing space S is decreased. As stated above, the density of the ions in the second plasma is controlled by controlling the ratio between the plasma generation powers respectively supplied to the upper electrode 21 and the lower electrode 22. In this way, the density of the ions and the density of the radicals in the second plasma within the processing space can be independently adjusted to achieve a required processing characteristic of the processing target object (semiconductor wafer W).

Moreover, after controlling the ratio between the plasma generation powers respectively supplied to the upper electrode 21 and the lower electrode 22, the control unit 60 may adjust the phase difference between the plasma generation powers respectively supplied to the upper electrode 21 and the lower electrode 22. In this case, the control unit 60 may adjust the phase difference between the plasma generation powers by the power splitter 23. For example, the control unit 60 outputs, to the power splitter 23, 180° as a control value for the phase difference between the plasma generation powers adjusted by the power splitter 23. As a result, it is possible to generate the first plasma in the gas diffusion space efficiently without changing the total amount of the plasma generation powers respectively supplied to the upper electrode 21 and the lower electrode 22.

Figure 3:
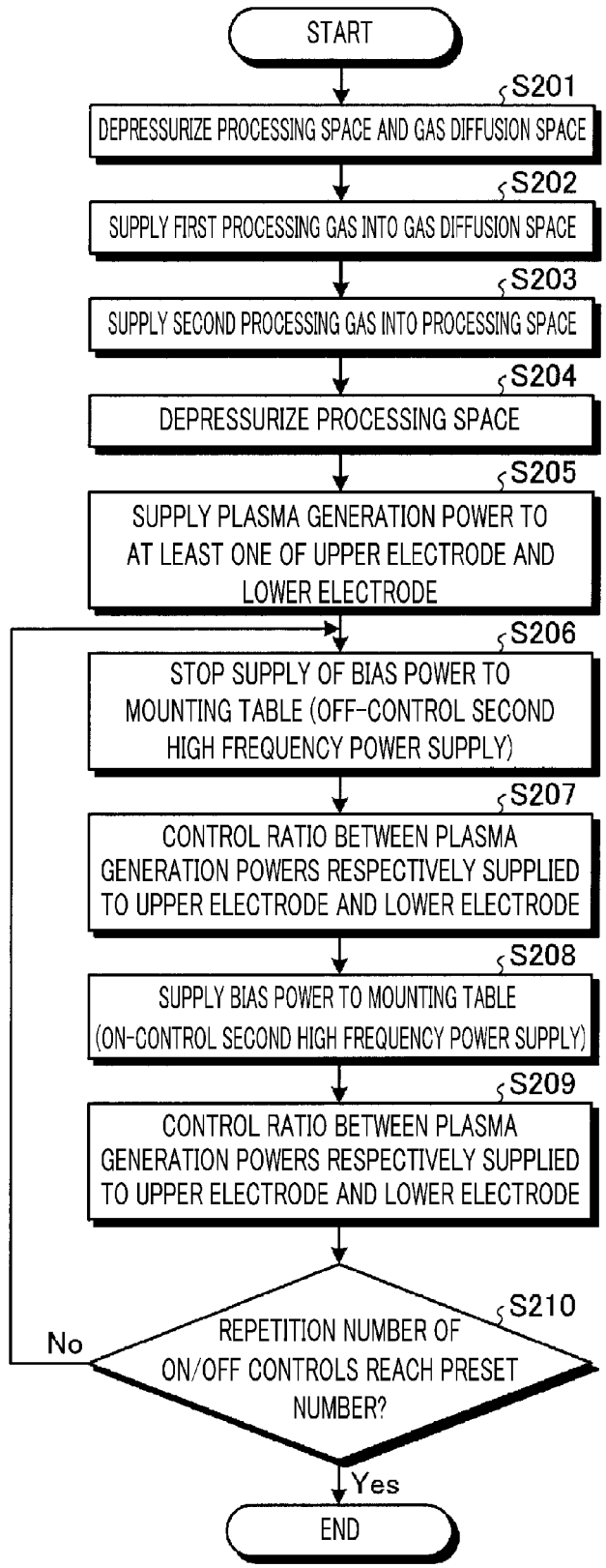
FIG. 3 is a flowchart for describing another example of a processing sequence of a plasma process performed in the plasma processing apparatus according to the first exemplary embodiment.

Now, another example of a processing sequence of a plasma process performed in the plasma processing apparatus according to the first exemplary embodiment will be explained. FIG. 3 is a flowchart illustrating another example of the processing sequence of the plasma process performed in the plasma processing apparatus according to the first exemplary embodiment. In the example shown in FIG. 3, a processing sequence of a plasma process in case of performing the ALE process is illustrated.

As depicted in FIG. 3, the plasma processing apparatus depressurizes the processing space S and the gas diffusion space 16c within the processing vessel 1 (process S201). Then, the plasma processing apparatus supplies the first processing gas into the gas diffusion space 16c of the dielectric member 16 (process S202). For example, the plasma processing apparatus supplies $Cl_2$ or the like into the gas diffusion space 16c of the dielectric member 16 as the first processing gas.

A more specific example will be elaborated. The control unit 60 of the plasma processing apparatus supplies the first processing gas into the gas diffusion space 16c of the dielectric member 16 from the first gas supply source 18.

Then, the plasma processing apparatus supplies the second processing gas into the processing space S within the processing vessel 1 (process S203). For example, the plasma processing apparatus supplies Ar or the like into the processing space S within the processing vessel 1 as the second processing gas.

A more specific example will be elaborated. The control unit 60 of the plasma processing apparatus supplies the second processing gas into the processing space S within the processing vessel 1 from the second gas supply source 20.

Then, the plasma processing apparatus depressurizes the processing space S until a pressure difference between the processing space S and the gas diffusion space 16c is stabilized (process S204). For example, the plasma processing apparatus depressurizes the processing space S within the processing vessel 1 until the pressure of the processing space S within the processing vessel 1 becomes equal to or less than 1/10 (desirably, 1/100) of the pressure of the gas diffusion space 16c of the dielectric member 16.

A more specific example will be elaborated. The control unit 60 of the plasma processing apparatus depressurizes the processing space S within the processing vessel 1 by operating the gas exhaust device 73. At this time, the diameters of the communication holes between the processing space S and the gas diffusion space 16c are adjusted in advance, and the processing space S is depressurized such that a stable pressure difference between the processing space S and the gas diffusion space 16c is obtained. By the depressurization of the processing space S, the first processing gas and radicals in a first plasma generated in the gas diffusion space 16c are introduced into the processing space S from the gas diffusion space 16c through the communication holes.

Subsequently, the plasma processing apparatus supplies the plasma generation power to at least one of the upper electrode 21 and the lower electrode 22 (process S205). By way of example, the plasma processing apparatus supplies the high frequency power of 400 kHz to at least one of the upper electrode 21 and the lower electrode 22 as the plasma generation power.

A more specific example will be elaborated. By supplying the plasma generation power to at least one of the upper electrode 21 and the lower electrode 22 from the first high frequency power supply 10a via the power splitter 23, the control unit 60 of the plasma processing apparatus generates the first plasma of the first processing gas supplied into the gas diffusion space 16c.

A more specific example will be elaborated. By controlling the total amount of the plasma generation powers respectively supplied to the upper electrode 21 and the lower electrode 22, the control unit 60 of the plasma processing apparatus adjusts the amount of radicals in the first plasma supplied into the processing space S from the gas diffusion space 16c through the communication holes, and, by these radicals, also adjusts the amount of radicals in the second plasma. Accordingly, the density of the radicals in the second plasma is controlled by the total amount of the plasma generation powers respectively supplied to the upper electrode 21 and the lower electrode 22.

Thereafter, the plasma processing apparatus stops a supply of a bias power to the mounting table 2 (process S206).

A more specific example will be elaborated. The control unit 60 of the plasma processing apparatus controls the second high frequency power supply 10*b* to be turned OFF.

Then, the plasma processing apparatus controls the ratio between the plasma generation powers respectively supplied to the upper electrode 21 and the lower electrode 22 (process S207). For example, the plasma processing apparatus controls the ratio between the plasma generation powers respectively supplied to the upper electrode 21 and the lower electrode 22 by the power splitter 23 configured to split the plasma generation power and distribute the split powers to the upper electrode 21 and the lower electrode 22, respectively.

A more specific example will be elaborated. During a period while the second high frequency power supply 10*b* is controlled to be turned OFF, by controlling the ratio between the plasma generation powers respectively supplied to the upper electrode 21 and the lower electrode 22, the control unit 60 of the plasma processing apparatus adjusts the amount of electrons in the first plasma supplied into the processing space S from the gas diffusion space 16*c* through the communication holes, and, the surface of the semiconductor wafer W is activated by these electrons, and a reaction product is generated by a reaction between the activated surface of the semiconductor wafer W and the radicals in the first plasma introduced into the processing space S. At this time, the control unit 60 outputs, to the power splitter 23, a value of P1:P2=(plasma generation power supplied to the upper electrode 21):(plasma generation power supplied to the lower electrode 22) as a control value for the split ratio of the power splitter 23. By way of example, for the split ratio of the power splitter 23, the control unit 60 outputs a control value in which the P2 is larger than the P1. As the P2 is increased with respect to the P1, the number of electrons in the first plasma moved into the processing space S from the gas diffusion space 16*c* through the communication holes is increased. As a result, the number of electrons to activate the surface of the semiconductor wafer W is increased as well, so that the thickness of the reaction product is also increased on the atomic layer basis. As another example, for the split ratio of the power splitter 23, the control unit 60 outputs a control value in which the P2 is smaller than the P1. As the P2 is decreased with respect to the P1, the number of electrons in the first plasma moved into the processing space S from the gas diffusion space 16*c* through the communication holes is decreased. As a result, the number of electrons to activate the surface of the semiconductor wafer W is decreased as well, so that the thickness of the reaction product is also decreased on the atomic layer basis.

Moreover, after controlling the ratio between the plasma generation powers respectively supplied to the upper electrode 21 and the lower electrode 22, the control unit 60 may adjust the phase difference between the plasma generation powers respectively supplied to the upper electrode 21 and the lower electrode 22. In this case, the control unit 60 may adjust the phase difference between the plasma generation powers by the power splitter 23. For example, the control unit 60 outputs, to the power splitter 23, 180° as a control value for the phase difference between the plasma generation powers adjusted by the power splitter 23. As a result, it is possible to generate the first plasma in the gas diffusion space efficiently without changing the total amount of the plasma generation powers respectively supplied to the upper electrode 21 and the lower electrode 22.

Subsequently, the plasma processing apparatus supplies the bias power to the mounting table 2 (process S208).

A more specific example will be elaborated. The control unit 60 of the plasma processing apparatus controls the second high frequency power supply 10*b* to be turned ON. That is, by supplying the bias power to the mounting table 2 from the second high frequency power supply 10*b*, the control unit 60 generates the third plasma of the first and second processing gases ($Cl_2$, Ar, etc.) introduced into the processing space S, and allows the ions in the generated third plasma to be attracted into the semiconductor wafer W. Here, in order to improve the effect of Ar ions, a flow rate ratio between the $Cl_2$ gas and the Ar gas may be set to about 1:100.

Subsequently, the plasma processing apparatus controls the ratio between the plasma generation powers respectively supplied to the upper electrode 21 and the lower electrode 22 (process S209). For example, the plasma processing apparatus controls the ratio between the plasma generation powers respectively supplied to the upper electrode 21 and the lower electrode 22 by the power splitter 23 configured to split the plasma generation power and distribute the split powers to the upper electrode 21 and the lower electrode 22, respectively.

A more specific example will be elaborated. During a period while the second high frequency power supply 10*b* is controlled to be turned ON, by controlling the ratio between the plasma generation powers respectively supplied to the upper electrode 21 and the lower electrode 22, the control unit 60 of the plasma processing apparatus adjusts the amount of electrons in the first plasma supplied into the processing space S from the gas diffusion space 16*c* through the communication holes; adjusts, by these electrons, the amount of ions in the third plasma; and etches the reaction product by the third plasma in which the amount of ions is controlled. At this time, the control unit 60 outputs, to the power splitter 23, a value of P1:P2=(plasma generation power supplied to the upper electrode 21):(plasma generation power supplied to the lower electrode 22) as a control value for the split ratio of the power splitter 23. By way of example, for the split ratio of the power splitter 23, the control unit 60 outputs a control value in which the P2 is larger than the P1. As the P2 is increased with respect to the P1, the number of electrons in the first plasma moved into the processing space S from the gas diffusion space 16*c* through the communication holes is increased. As a result, the number of electrons which are collided with gas atoms in the first and second processing gases within the processing space S is increased as well, so that the amount of ions in the third plasma generated in the processing space S is also increased. As a result, an etching depth upon the reaction product is increased on the atomic layer basis. As another example, for the split ratio of the power splitter 23, the control unit 60 outputs a control value in which the P2 is smaller than the P1. As the P2 is decreased with respect to the P1, the number of electrons in the first plasma moved into the processing space S from the gas diffusion space 16*c* through the communication holes is decreased. As a result, the number of the electrons which are collided with the gas atoms in the first and second processing gases within the processing space S is also decreased, so that the amount of ions in the third plasma generated in the processing space S is decreased. Accordingly, the etching depth upon the reaction product is decreased on the atomic layer basis.

Moreover, after controlling the ratio between the plasma generation powers respectively supplied to the upper electrode 21 and the lower electrode 22, the control unit 60 may adjust the phase difference between the plasma generation powers respectively supplied to the upper electrode 21 and the lower electrode 22. In this case, the control unit 60 may adjust the phase difference between the plasma generation powers by the power splitter 23. For example, the control unit 60 outputs, to the power splitter 23, 180° as a control value for the phase difference between the plasma generation powers adjusted by the power splitter 23. As a result, it is possible to generate the first plasma in the gas diffusion space efficiently without changing the total amount of the plasma generation powers respectively supplied to the upper electrode 21 and the lower electrode 22.

Thereafter, if the number of repetition of the ON/OFF controls over the second high frequency power supply 10b has yet to reach a preset number (process S210; No), the plasma processing apparatus returns the process back to the process S206. Meanwhile, if the number of repetition of the ON/OFF controls over the second high frequency power supply 10b is found to reach the present number (process S210; Yes), the plasma processing apparatus finishes the plasma process.

As stated above, according to the first exemplary embodiment, by controlling the total amount of the plasma generation powers respectively supplied to the upper electrode 21 and the lower electrode 22 from the first high frequency power supply 10a, the amount of the radicals in the first plasma supplied into the processing space S from the gas diffusion space 16c through the communication holes is adjusted, and, by these radicals, the amount of the radicals in the second plasma is also adjusted. Further, by controlling the ratio between the plasma generation powers respectively supplied to the upper electrode 21 and the lower electrode 22 from the first high frequency power supply 10a, the amount of the electrons in the first plasma supplied into the processing space S from the gas diffusion space 16c through the communication holes is adjusted, and, by these electrons, the amount of the ions in the second plasma is also adjusted. Thus, according to the first exemplary embodiment, it is possible to control the amount of the radicals and the amount of the ions in the plasma within the processing space S to appropriate quantities independently. As a result, according to the first exemplary embodiment, the ion density for obtaining a required processing characteristic such as a CD or a mask selectivity in the processing target surface of the processing target object can be adjusted independently of the radical density.

Here, as a comparative example, assume that the inside of the processing vessel is divided into two spaces by a grid electrode having a multiple number of through holes: one is a plasma generation space in which a plasma is generated therein, and the other is a processing space for processing a processing target object therein with plasma. In the comparative example, however, a sheath is not formed between the plasma generated in the plasma generation space and the plasma generated in the processing space, and the plasmas have the same potential. For this reason, in the comparative example, it is difficult to adjust the ion density for obtaining a required processing characteristic such as a CD or a mask selectivity in the processing target surface of the processing target object, independently of the radical density.

Figure 4:
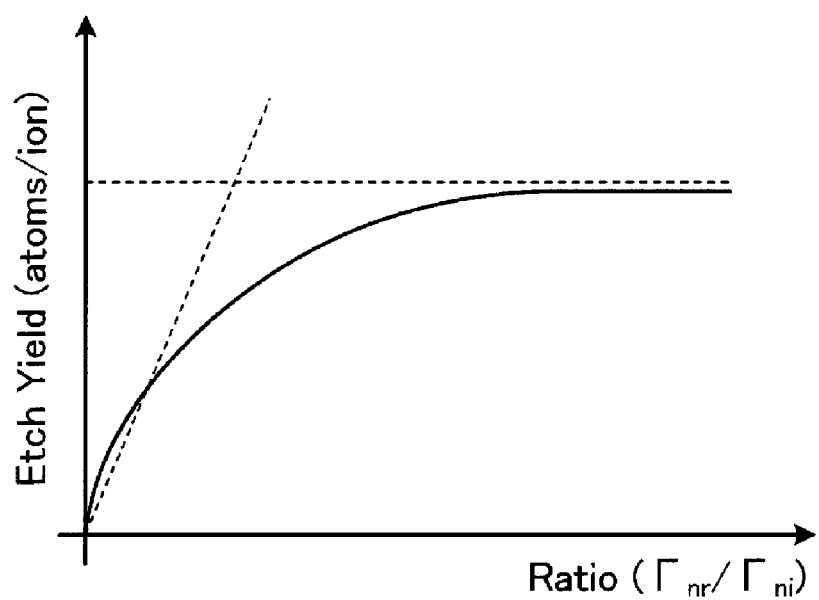
FIG. 4 is a diagram for describing a case of controlling a ratio between plasma generation powers respectively supplied to an upper electrode and a lower electrode.

FIG. 4 is a diagram for describing a case of controlling the total amount of the plasma generation powers respectively supplied to the upper electrode and the lower electrode, or controlling the ratio therebetween. In FIG. 4, a horizontal axis represents a ratio $\Gamma_{nr}/\Gamma_{ni}$ between a radical amount $\Gamma nr$ in the plasma within the processing space S and an ion amount $\Gamma_{ni}$ in the plasma within the processing space S, and a vertical axis represents an etch yield which is a parameter indicating how many atoms forming the surface of the processing target object are etched by a single ion. Here, the etch yield is proportion to a plasma processing rate (etching rate) in a plasma process. That is, the etch yield is determined by interaction between the ion amount and the radical amount. Further, details of the correlation between the ratio $\Gamma_{nr}/\Gamma_{ni}$ and the etch yield shown in FIG. 4 is described in 'R. A. Gottscho, Gaseous Electronics Conference & American Physical Society, November, 2011', and description thereof is omitted herein.

By controlling the total amount of the plasma generation powers respectively supplied to the upper electrode 21 and the lower electrode 22, it is possible to adjust the amount of the radicals in the first plasma supplied into the processing space S from the gas diffusion space 16c through the communication holes and, also, to adjust the amount of the radicals in the second plasma by these radicals. Further, by controlling the ratio between the plasma generation powers respectively supplied to the upper electrode 21 and the lower electrode 22 from the first high frequency power supply 10a, it is possible to allow the electrons in the first plasma to be moved into the processing space S from the gas diffusion space 16c through the communication holes and, also, to adjust the amount of the ions in the second plasma by these electrons. That is, in this case, the ratio $\Gamma_{nr}/\Gamma_{ni}$ between the radical amount $\Gamma_{nr}$ in the plasma within the processing space S and the ion amount $\Gamma_{ni}$ in the plasma within the processing space S can be changed as required. Accordingly, as depicted in FIG. 4, it is possible to adjust the etch yield to an optimum value by changing the ratio $\Gamma_{nr}/\Gamma_{ni}$. As a consequence, a required processing characteristic such as a CD or a mask selectivity in the processing target surface of the processing target object can be achieved. By way of example, to etch the wafer W uniformly over the entire surface thereof while maintaining the etch yield (etching rate) constant, the ratio $\Gamma_{nr}/\Gamma_{ni}$ between the radical amount $\Gamma_{nr}$ and the ion amount $\Gamma_{ni}$ in the second plasma needs to be set to be large.

As stated above, according to the first exemplary embodiment, it is possible to obtain a required processing characteristic such as a CD or a mask selectivity in the processing target surface of the processing target object, as compared to the comparative example where the inside of the processing vessel is divided into the plasma generation space and the processing space by the grid electrode.

Furthermore, in the first exemplary embodiment, the ON/OFF of the second high frequency power supply 10b are controlled intermittently. During a period while the second high frequency power supply 10b is controlled to be turned OFF, by controlling the ratio between the plasma generation powers respectively supplied to the upper electrode 21 and the lower electrode 22, the amount of the electrons in the first plasma supplied into the processing space S from the gas diffusion space 16c through the communication holes is adjusted; the surface of the processing target object is activated by these electrons; and the reaction product is generated by reacting the activated surface of the processing target object with the radicals in the first plasma introduced into the processing space S. Furthermore, in the first exemplary embodiment, during a period while the second high frequency power supply 10b is controlled to be turned ON, by controlling the ratio between the plasma generation powers respectively supplied to the upper electrode 21 and the lower electrode 22, the amount of the electrons in the first plasma supplied into the processing space S from the gas diffusion space 16c through the communication holes is adjusted; the amount of the ions in the third plasma is adjusted by these electrons; and the reaction product is etched by the third plasma in which the amount of the ions is controlled. As a result, even when the ALE process is performed, it is possible to independently control the ion density and the radical density for obtaining a required processing characteristic such as a CD or a mask selectivity in the processing target surface of the processing target object.

Modification Examples

Figure 5:
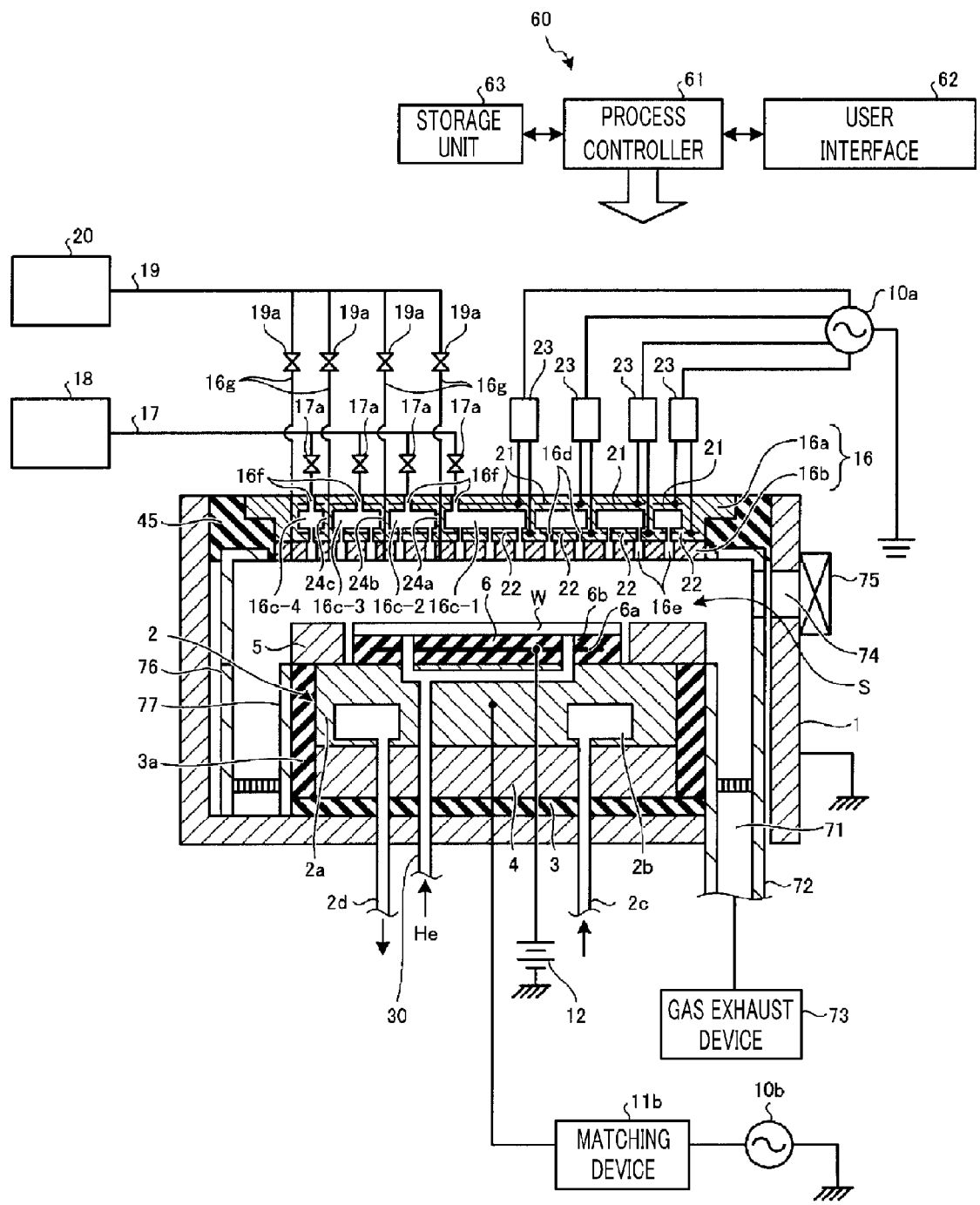
FIG. 5 is a schematic cross sectional view illustrating a modification example of the plasma processing apparatus according to the first exemplary embodiment.
Figure 6:
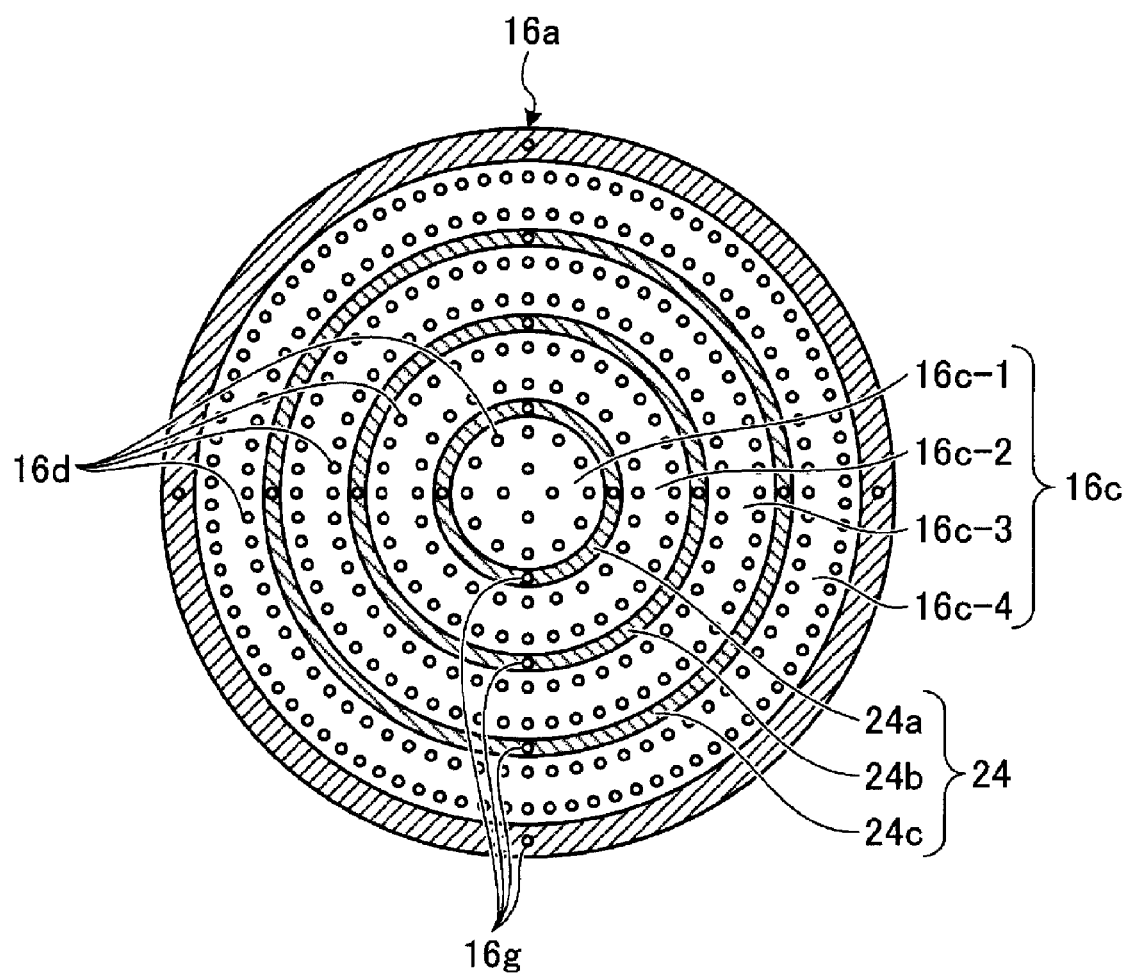
FIG. 6 is a schematic plane view for describing an example structure of a dielectric member shown in FIG. 5.

Now, a modification example of the plasma processing apparatus according to the first exemplary embodiment will be described. FIG. 5 is a schematic cross sectional view illustrating a modification example of the plasma processing apparatus according to the first exemplary embodiment. FIG. 6 is a schematic plane view for describing an example structure of a dielectric member shown in FIG. 5. A plasma processing apparatus according to this modification example is different from the plasma processing apparatus shown in FIG. 1 in the structure of the dielectric member 16, the arrangement of the upper electrode 21 and the lower electrode 22, and the controlling operations of the control unit 60, and the other configurations are the same as shown in FIG. 1. Thus, redundant description of the same parts as those of the plasma processing apparatus shown in FIG. 1 will be omitted herein.

As depicted in FIG. 5 and FIG. 6, in the plasma processing apparatus according to the modification example, one or more annular partition walls 24 are provided within a gas diffusion space 16c of an upper dielectric member 16a of the dielectric member 16. The one or more annular partition walls 24 are arranged at different positions in a radial direction of the dielectric member 16, i.e., in a radial direction of a semiconductor wafer W. In FIG. 6, the one or more annular partition wall 24 includes a first annular partition wall 24a, a second annular partition wall 24b and a third annular partition wall 24c which are arranged along the radial direction of the semiconductor wafer W in sequence from the center thereof. With this configuration, the gas diffusion space 16c of the upper dielectric member 16a is divided into a first gas diffusion space 16c-1, a second gas diffusion space 16c-2, a third gas diffusion space 16c-3 and a fourth gas diffusion space 16c-4 along the radial direction of semiconductor wafer W in sequence from the center thereof. As stated, the gas diffusion space 16c of the upper dielectric member 16a is divided into concentric sub-spaces along the radial direction of the semiconductor wafer W.

Here, the number of the annular partition walls 24 is not particularly limited as long as at least one is provided. By way of example, three annular partition walls may be provided as depicted in FIG. 6, or two annular partition walls or more than four or more annular partition walls may be provided.

Multiple gas through holes 16d are formed at the bottom portion of each of the first to fourth gas diffusion spaces 16c-1 to 16c-4.

Further, the lower dielectric member 16b is provided with a multiple number of gas inlet holes 16e formed through the lower dielectric member 16b in a thickness direction thereof such that the gas inlet holes 16e of the lower dielectric member 16b communicate with the gas through holes 16d of the upper dielectric member 16a, respectively. The gas inlet holes 16e of the lower dielectric member 16b and the gas through holes 16d of the upper dielectric member 16a form communication holes through which the gas diffusion space 16c communicates with the processing space S. Accordingly, each of the first to fourth gas diffusion spaces 16c-1 to 16c-4 communicates with the processing space S through the communication holes. With this configuration, the first processing gas supplied into the gas diffusion space 16c is introduced into the processing space S within the processing vessel 1 via the gas through holes 16d and the gas inlet holes 16e in a distributed manner as in a shower device. In the following description, the gas through holes 16d and the gas inlet holes 16e may sometimes be appropriately referred to "communication holes."

The dielectric member 16 (upper dielectric member 16a) is provided with four gas inlet openings 16f through which the processing gas is introduced into the first to fourth gas diffusion spaces 16c-1 to 16c-4, respectively. Four branch lines which are branched from the gas supply line 17 are connected to the gas inlet openings 16f, respectively, and the base end portion of the gas supply line 17 is connected to the first gas supply source 18. Furthermore, each of the four branch lines branched from the gas supply line 17 is equipped with the valve 17a configured to open or close the gas supply line 17, a non-illustrated flow rate controller (MFC: Mass Flow Controller), and so forth.

In the dielectric member 16, multiple through holes 16g are formed through the upper dielectric member 16a, the annular partition walls 24 and the lower dielectric member 16b in a thickness direction thereof to reach the processing space S within the processing vessel 1. Plural branch lines branched from the gas supply line 19 are connected to the through holes 16g, respectively, and the base end portion of the gas supply line 19 is connected to the second gas supply source 20. Further, each of the branch lines branched from the gas supply line 19 is equipped with the valve 19a configured to open or close the gas supply line 19, a non-illustrated flow rate controller (MFC), and so forth.

Further, multiple pairs of the upper electrode 21 and the lower electrode 22 are provided at positions corresponding to the four gas diffusion spaces within the dielectric member 16 (upper dielectric member 16a), respectively. The upper electrode 21 and the lower electrode 22 in each pair are arranged to face each other with the corresponding one of the four gas diffusion spaces therebetween.

Each pair of the upper electrode 21 and the lower electrode 22 is connected to the first high frequency power supply 10a via the corresponding one of multiple power splitters 23. The first high frequency power supply 10a is configured to supply the high frequency power to at least one of the upper electrode 21 and the lower electrode 22 in each pair via the corresponding one of the multiple power splitters 23. To elaborate, the first high frequency power supply 10a supplies the high frequency power to at least one of the upper electrode 21 and the lower electrode 22 in each pair via the corresponding one of the multiple power splitters 23. As a result, the plasma of the first processing gas, which is supplied from the first gas supply source 18 into each of the four gas diffusion spaces, is generated independently within each of the four gas diffusion spaces. In the following description, the high frequency power supplied from the first high frequency power supply 10a to at least one of the upper electrode 21 and the lower electrode 22 in each pair via the corresponding one of the multiple power splitters 23 will be appropriately referred to as "plasma generation power."

Further, in the following description, the plasmas of the first processing gas generated within the four gas diffusion space independently by supplying the plasma generation power will be appropriately referred to as "first plasma."

Each of the multiple power splitters 23 is configured to split the plasma generation power inputted from the first high frequency power supply 10a into the upper electrode 21 and the lower electrode 22. A total amount of the split plasma generation powers by each of the multiple power splitters 23 and a split ratio therebetween, that is, the total amount of plasma generation powers respectively supplied to the upper electrode 21 and the lower electrode 22 from the first high frequency power supply 10a and a ratio therebetween are variable. Control values for the total amount of the powers and the split ratio of each power splitter 23 are individually inputted by, for example, the control unit 60 to be described later. That is, each of the multiple power splitters 23 is configured to split the plasma generation power inputted from the first high frequency power supply 10a into the upper electrode 21 and the lower electrode 22 with the control values for the total amount of the powers and the split ratio inputted by the control unit 60.

The control unit 60 according to the modification example adjusts the amount of radicals in the first plasma supplied into the processing space S from each of the four gas diffusion spaces through the communication holes by controlling the total amount of the plasma generation powers respectively supplied to the upper electrode 21 and the lower electrode 22 from the first high frequency power supply 10a. Further, the control unit 60 according to the modification example also adjusts the amount of electrons in the first plasma supplied into the processing space S from each of the four gas diffusion spaces through the communication holes by controlling the ratio between the plasma generation powers respectively supplied to the upper electrode 21 and the lower electrode 22 from the first high frequency power supply 10a. Further, distributions of the amount of radicals and the amount of ions in the second plasma along the radial direction of the semiconductor wafer W are adjusted by the radicals and the electrons. For example, the control unit 60 controls the total amount of the plasma generation powers respectively supplied to the upper electrode 21 and the lower electrode 22 and the ratio between these plasma generation powers by the power splitters 23 configured to split the plasma generation powers to the upper electrode 21 and the lower electrode 22.

A more specific example will be described. By controlling the total amount of plasma generation powers respectively supplied to the upper electrode 21 and the lower electrode 22, the control unit 60 adjusts the amount of radicals in the first plasma supplied into the processing space S from each of the four gas diffusion spaces through the communication holes. Further, by these radicals, the control unit 60 adjusts the amount of radicals in the second plasma. At this time, the control unit 60 outputs the total amount of the powers split by each of the power splitters 23 to the corresponding power splitter 23 individually as a control value. Accordingly, the density of the radicals in the second plasma is controlled by the total amount of the plasma generation powers respectively supplied to the upper electrode 21 and the lower electrode 22. Thus, it is possible to adjust the distribution of the amount of the radicals in the second plasma in the radial direction of the semiconductor wafer W. Furthermore, by controlling the ratio between the plasma generation powers respectively supplied to the upper electrode 21 and the lower electrode 22, the control unit 60 adjusts the amount of electrons in the first plasma supplied into the processing space S from each of the four gas diffusion spaces through the communication holes. Further, by these electrons, the control unit 60 adjusts the amount of ions in the second plasma. At this time, the control unit 60 outputs, to each of the multiple power splitters 23 individually, a value of P1:P2=(plasma generation power supplied to the upper electrode 21):(plasma generation power supplied to the lower electrode 22) as a control value for the split ratio of each of the power splitters 23. By way of example, the control unit 60 outputs a control value for the split ratio of the power splitter 23, in which the P2 is larger than the P1. As the P2 is increased with respect to the P1, the number of the electrons in the first plasma moved into the processing space S from the gas diffusion space 16c through the communication holes is increased. As a result, the number of electrons that collide with gas atoms in the processing gas within the processing space S is increased as well, so that the amount of the ions in the second plasma generated in the processing space S is also increased. Further, for example, the control unit 60 outputs a control value for the split ratio of the power splitter 23, in which the P2 is smaller than the P1. As the P2 is decreased with respect to the P1, the number of the electrons in the first plasma moved into the processing space S from the gas diffusion space 16c through the communication holes is decreased. As a result, the number of electrons which are collided with the gas atoms in the processing gas within the processing space S is also decreased, so that the amount of the ions in the second plasma generated in the processing space S is decreased. Thus, it is possible to adjust the distribution of the amount of the ions in the second plasma along the radial direction of the semiconductor wafer W.

According to the plasma processing apparatus of the modification example, the total amount of the plasma generation powers respectively supplied to the upper electrode 21 and the lower electrode 22 from the first high frequency power supply 10a and the ratio between these plasma generation powers can be controlled independently. Furthermore, according to the plasma processing apparatus of the modification example, the amount of the radicals and the amount of the electrons in the first plasma supplied into the processing space S from each of the four gas diffusion spaces through the communication holes can also be adjusted independently. By using the radicals and the electrons, the distributions of the amount of the radical and amount of the ion in the second plasma can be adjusted independently in the radial direction of the semiconductor wafer W. As a result, it is possible to adjust the distributions of the radical density and the ion density along the radial direction of the semiconductor wafer W independently.

EXPLANATION OF REFERENCE NUMERALS

W: Semiconductor wafer
S: Processing space
1: Processing vessel
2: Mounting table
10a: First high frequency power supply
10b: Second high frequency power supply
16: Dielectric member
16a: Upper dielectric member
16b: Lower dielectric member
16c: Gas diffusion space
16d: Gas through hole
16e: Gas inlet hole
18: First gas supply source
20: Second gas supply source 21: Upper electrode
22: Lower electrode
23: Power splitter
60: Control unit
73: Gas exhaust device

We claim:

1. A plasma processing apparatus, comprising:
a processing vessel having a processing space formed therein;
a mounting table provided within the processing space, and configured to mount a processing target object thereon;
a dielectric member, disposed at the processing vessel to close the processing space, having an internal space and communication holes through which the internal space is allowed to communicate with the processing space;
a first electrode and a second electrode provided within the dielectric member and arranged to face each other with the internal space therebetween;
a first gas supply device configured to supply a first processing gas for a plasma process into the internal space;
a first high frequency power supply configured to supply a first high frequency power to the first electrode and the second electrode to generate a first plasma of the first processing gas supplied into the internal space;
a power splitter configured to split the first high frequency power inputted from the first high frequency power supply into a first split power and a second split power, and distribute the first split power and the second split power to the first electrode and the second electrode, respectively;
a depressurizing device configured to depressurize the processing space to introduce the first processing gas and radicals in the first plasma into the processing space from the internal space through the communication holes;
a second high frequency power supply configured to supply a second high frequency power to the mounting table to generate a second plasma of the first processing gas introduced into the processing space and to attract ions in the second plasma into the processing target object; and
a control unit configured to adjust, by controlling a total amount of the first split power supplied to the first electrode and the second split power supplied to the second electrode, an amount of the radicals in the first plasma introduced into the processing space from the internal space through the communication holes and adjust, by the radicals, an amount of radicals in the second plasma; and configured to adjust, by controlling a ratio between the first split power and the second split power, an amount of electrons in the first plasma introduced into the processing space from the internal space through the communication holes and adjust, by the electrons, an amount of the ions in the second plasma.

2. The plasma processing apparatus of claim 1, further comprising:
a second gas supply device configured to supply a second processing gas into the processing space,
wherein the second high frequency power supply supplies the second high frequency power to the mounting table to generate a third plasma of the first processing gas and the second processing gas supplied into the processing space and to attract ions in the third plasma into the processing target object,
the control unit controls ON/OFF of the second high frequency power supply, intermittently,
during a period while the second high frequency power supply is controlled to be turned OFF, by controlling the ratio between the first split power supplied to the first electrode and the second split power supplied to the second electrode, the control unit adjusts the amount of the electrons in the first plasma introduced into the processing space from the internal space through the communication holes; activates a surface of the processing target object by the electrons; and generates a reaction product by reacting the activated surface of the processing target object with the radicals in the first plasma introduced into the processing space, and
during a period while the second high frequency power supply is controlled to be turned ON, by controlling the ratio between the first split power supplied to the first electrode and the second split power supplied to the second electrode, the control unit adjusts the amount of the electrons in the first plasma introduced into the processing space from the internal space through the communication holes; adjusts an amount of the ions in the third plasma by the electrons; and etches the reaction product with the third plasma in which the amount of the ions is controlled.

3. The plasma processing apparatus of claim 1,
wherein the control unit adjusts a phase difference between the first split power supplied to the first electrode and the second split power supplied to the second electrode.

4. The plasma processing apparatus of claim 3,
wherein the control unit adjusts the phase difference between the first split power supplied to the first electrode and the second split power supplied to the second electrode to be 180°.

5. A plasma processing apparatus, comprising:
a processing vessel having a processing space formed therein;
a mounting table provided within the processing space, and configured to mount a processing target object thereon;
a dielectric member, disposed at the processing vessel to close the processing space, having an internal space and communication holes through which the internal space is allowed to communicate with the processing space;
a first electrode and a second electrode provided within the dielectric member and arranged to face each other with the internal space therebetween;
a first gas supply device configured to supply a first processing gas for a plasma process into the internal space;
a first high frequency power supply configured to supply a first high frequency power to at least one of the first electrode and the second electrode to generate a first plasma of the first processing gas supplied into the internal space;
a depressurizing device configured to depressurize the processing space to introduce the first processing gas and radicals in the first plasma into the processing space from the internal space through the communication holes;

a second high frequency power supply configured to supply a second high frequency power to the mounting table to generate a second plasma of the first processing gas introduced into the processing space and to attract ions in the second plasma into the processing target object; and a control unit configured to adjust, by controlling a total amount of the first high frequency power supplied to the first electrode and the first high frequency power supplied to the second electrode, an amount of the radicals in the first plasma introduced into the processing space from the internal space through the communication holes and adjust, by the radicals, an amount of radicals in the second plasma; and configured to adjust, by controlling a ratio between the first high frequency power supplied to the first electrode and the first high frequency power supplied to the second electrode, an amount of electrons in the first plasma introduced into the processing space from the internal space through the communication holes and adjust, by the electrons, an amount of the ions in the second plasma, wherein the internal space of the dielectric member is divided into a plurality of concentric sub-spaces along a radial direction of the processing target object, each of the sub-spaces communicates with the processing space through the communication holes, the first electrode and the second electrode are provided at each of the sub-spaces, and arranged to face each other with a corresponding one of the sub-spaces therebetween, by controlling the total amount of the first high frequency power supplied to the first electrode and the first high frequency power supplied to the second electrode, the control unit adjusts the amount of the radicals in the first plasma introduced into the processing space from each of the sub-spaces through the communication holes and adjusts a distribution of the amount of the radicals in the second plasma along the radial direction of the processing target object by the radicals, and by controlling the ratio between the first high frequency power supplied to the first electrode and the first high frequency power supplied to the second electrode, the control unit adjusts the amount of the electrons in the first plasma introduced into the processing space from each of the sub-spaces through the communication holes and adjusts a distribution of the amount of the ions in the second plasma along the radial direction of the processing target object by the electrons.

6. A plasma processing method performed in a plasma processing apparatus including a processing vessel having a processing space formed therein; a mounting table provided within the processing space, and configured to mount a processing target object thereon; a dielectric member, disposed at the processing vessel to close the processing space, having an internal space and communication holes through which the internal space is allowed to communicate with the processing space; a first electrode and a second electrode provided within the dielectric member and arranged to face each other with the internal space therebetween; a first gas supply device configured to supply a first processing gas for a plasma process into the internal space; a first high frequency power supply configured to supply a first high frequency power to the first electrode and the second electrode to generate a first plasma of the first processing gas supplied into the internal space; a power splitter configured to split the first high frequency power inputted from the first high frequency power supply into a first split power and a second split power, and distribute the first split power and the second split power to the first electrode and the second electrode, respectively; a depressurizing device configured to depressurize the processing space and, thus, introduce the first processing gas and radicals in the first plasma into the processing space from the internal space through the communication holes; a second high frequency power supply configured to supply a second high frequency power to the mounting table to generate a second plasma of the first processing gas introduced into the processing space and to attract ions in the second plasma into the processing target object, the plasma processing method comprising:

adjusting an amount of the radicals in the first plasma introduced into the processing space from the internal space through the communication holes and adjusting, by these radicals, an amount of radicals in the second plasma by controlling a total amount of the first split power supplied to the first electrode and the second split power supplied to the second electrode; and adjusting an amount of electrons in the first plasma introduced into the processing space from the internal space through the communication holes and adjusting, by these electrons, an amount of ions in the second plasma by controlling a ratio between the first split power and the second split power.

* * * * *